United States Patent
Hamilton et al.

(10) Patent No.: US 6,735,114 B1
(45) Date of Patent: May 11, 2004

(54) METHOD OF IMPROVING DYNAMIC REFERENCE TRACKING FOR FLASH MEMORY UNIT

(75) Inventors: Darlene G. Hamilton, San Jose, CA (US); Eric M. Ajimine, Saratoga, CA (US); Ming-Huei Shieh, Cupertino, CA (US); Lee Cleveland, Santa Clara, CA (US); Edward F. Runnion, Santa Clara, CA (US); Mark W. Randolph, San Jose, CA (US); Sameer S. Haddad, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/357,879

(22) Filed: Feb. 4, 2003

(51) Int. Cl.⁷ .......................... G11C 16/04; G11C 16/06
(52) U.S. Cl. .................... 365/185.03; 365/185.12; 365/185.2; 365/185.29
(58) Field of Search .............. 365/185.03, 185.11, 365/185.12, 185.2, 185.29

(56) References Cited

U.S. PATENT DOCUMENTS

| | | | |
|---|---|---|---|
| 5,675,537 A * | 10/1997 | Bill et al. | 365/185.29 |
| 5,995,417 A * | 11/1999 | Chen et al. | 365/185.29 |
| 6,215,702 B1 | 4/2001 | Derhacobian et al. | |
| 6,246,611 B1 | 6/2001 | Pawletko et al. | |
| 6,252,803 B1 * | 6/2001 | Fastow et al. | 365/185.29 |
| 6,295,228 B1 | 9/2001 | Pawletko et al. | |
| 6,304,486 B1 * | 10/2001 | Yano | 365/185.2 |
| 6,307,784 B1 | 10/2001 | Hamilton et al. | |
| 6,309,926 B1 | 10/2001 | Bell et al. | |
| 6,327,181 B1 * | 12/2001 | Akaogi et al. | 365/185.11 |
| 6,331,951 B1 | 12/2001 | Bautista, Jr. et al. | |
| 6,344,994 B1 | 2/2002 | Hamilton et al. | |
| 6,356,482 B1 | 3/2002 | Derhacobian et al. | |
| 6,370,061 B1 | 4/2002 | Yachareni et al. | |
| 6,400,624 B1 | 6/2002 | Parker et al. | |
| 6,442,074 B1 | 8/2002 | Hamilton et al. | |
| 6,456,533 B1 | 9/2002 | Hamilton et al. | |
| 6,639,849 B2 * | 10/2003 | Takahashi et al. | 365/185.03 |

OTHER PUBLICATIONS

*Intel StrataFlash Memory Technology*, Intel Corporation, AP–677, Application Note, Dec. 1998, Order No. 297859–002.

* cited by examiner

*Primary Examiner*—Trong Phan
(74) *Attorney, Agent, or Firm*—Renner, Otto, Boisselle & Sklar, LLP

(57) ABSTRACT

A method of programming a memory unit having a plurality of dual cell core memory devices and at least one dual cell dynamic reference device. The memory unit is subjected to an erase configuration operation such that each cell of the core memory devices is in a blank state and such that a threshold voltage of the at least one dynamic reference device is less than a charged program level threshold voltage. Thereafter, the at least one dynamic reference and the core memory devices are programmed using a page programming routine.

18 Claims, 4 Drawing Sheets

METHOD OF IMPROVING DYNAMIC REFERENCE TRACKING FOR FLASH MEMORY UNIT

TECHNICAL FIELD

The present invention relates generally to the field of non-volatile memory devices and, more particularly, to a method of improving dynamic reference tracking for a memory unit having, for example, a plurality of charge trapping dielectric flash memory devices.

BACKGROUND

A pervasive trend in modern integrated circuit manufacture is to increase the amount of data stored per unit area on an integrated circuit memory unit, such as a flash memory unit. Memory units often include a relatively large number of core memory devices (sometimes referred to as core memory cells). For instance, a conventional dual cell memory device, such as a charge trapping dielectric flash memory device, can store data in a "double-bit" arrangement. That is, one bit can be stored using a memory cell on a first "side" of the memory device and a second bit can be stored using a complimentary memory cell on a second "side" of the memory device.

The memory unit can also be provided with one or more dynamic reference memory devices having charge storing cells similar to the charge storing cells of the core memory devices. The dynamic reference devices assist in reading the core memory devices. More specifically, the dynamic references are used as indicators of the data level (e.g., charge storage) behavior of the core memory. The dynamic reference cells are programmed to store an amount of charge such that the dynamic reference has a certain threshold voltage. Over time, the charge amount stored by the dynamic reference cells and other factors contributing to the threshold voltage of the dynamic reference device may change. These factors cause a corresponding change in the threshold voltage of the dynamic reference device. The change in dynamic reference device threshold voltage can be used by a logic circuit associated with the memory unit to account for drift in threshold voltage of the core memory devices.

In the past, the dynamic reference devices have been programmed prior to programming of the core memory devices. More specifically, the dynamic references are initially programmed during an erase configuration operation. The erase configuration operation "sets up" the core memory cells (e.g., places all core cells in a blank or erased state) for subsequent programming by a customer of the memory unit. As a result, the dynamic reference cells tend to age differently than the core cells. Also, the current loading when programming the dynamic references may not be the same as the current loading when programming the core cells. Since the dynamic references are programmed at a different time and under different conditions than the core cells, read margins of the dynamic reference devices versus the core memory devices may differ and read operation accuracy can suffer as a consequence. This is especially problematic over repeating program/erase (P/E) cycling of the memory unit.

As indicated, dynamic reference cells have conventionally been programmed during a erase configuration operation. Such an operation includes pre-programming core memory cells and the dynamic reference cells. Pre-programming of the cells can involve injecting a charge into charge storing regions of the cells. Thereafter, all of the programmed cells are erased. If any of the cells were over-erased, those over-erased cells can be soft-programmed such that each cell has an amount of charge corresponding to a predetermined blank state threshold voltage distribution. The erase configuration operation can conclude by programming the dynamic reference cells to store an appropriate amount of charge. At this point the memory unit is ready for use. For example, the core cells can be programmed. Programming the core cells can be carried out by a page program technique where groups of core cells (e.g., a selected number of core cells, such as about eight core cells) are sequentially programmed until all core cells to be programmed have been programmed. Following programming (e.g., in preparation for a read operation), the threshold voltages of the dynamic reference cells can be verified. If the threshold voltages have fallen below a specified value, the dynamic references can be refreshed. Refreshing the dynamic references may increase the above-mentioned difference in read margins between the dynamic references and core memory devices, especially over P/E cycling and/or aging where charge loss may occur in the various memory devices.

In view of the foregoing, there is a need in the art for improved dynamic reference device tracking with associated core memory devices of a flash memory unit.

SUMMARY OF THE INVENTION

According to one aspect of the invention, the invention is directed to a method of programming a memory unit having a plurality of dual cell core memory devices and at least one dual cell dynamic reference device. The method can include providing the memory unit, wherein the memory unit has been subjected to an erase configuration operation such that each cell of the core memory devices is in a blank state and wherein a threshold voltage of the at least one dynamic reference device is less than a charged program level threshold voltage; and programming the at least one dynamic reference and the core memory devices using a page programming routine.

According to another aspect of the invention, the invention is directed to a method of programming a memory unit having a plurality of dual cell core memory devices and at least one dual cell dynamic reference device. The method can include providing the memory unit, wherein the memory unit has been subjected to an erase configuration operation such that each cell of the core memory devices and of the at least one dynamic reference is in a blank state; pre-reading the at least one dynamic reference; and programming at least one cell of the at least one dynamic reference device and at least one cell of at least one core memory device with a program pulse.

According to yet another aspect of the invention, the invention is directed to a method of programming a memory unit having a plurality of dual cell core memory devices and at least one dual cell dynamic reference device. The method can include providing the memory unit, wherein the memory unit has been subjected to an erase configuration operation such that each cell of the core memory devices is in a blank state and wherein an amount of charge has been injected into at least one cell of the at least one dynamic reference device, the amount of charge establishing a threshold voltage of the dynamic reference device that falls between a blank program state and a charged program state; programming the at least one cell of the at least one dynamic reference device to the charged program state; and programming at least one cell of at least one core memory device to the charged program state.

BRIEF DESCRIPTION OF DRAWINGS

These and further features of the present invention will be apparent with reference to the following description and drawings, wherein.

DISCLOSURE OF INVENTION

Figure 1:
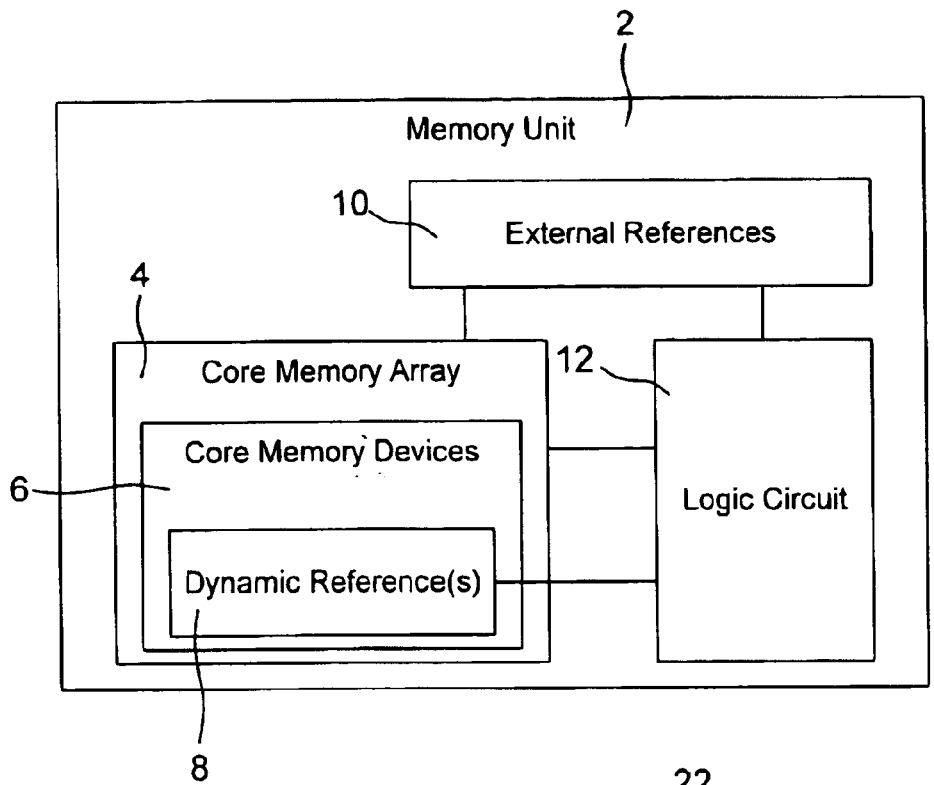
FIG. 1 is a schematic block diagram of an exemplary memory unit to which a method of programming a dynamic reference memory device in accordance with the present invention can be applied.

In the detailed description that follows, like components have been given the same reference numerals, regardless of whether they are shown in different embodiments of the present invention. To illustrate the present invention in a clear and concise manner, the drawings may not necessarily be to scale and certain features may be shown in somewhat schematic form.

With reference to FIG. 1, shown is a schematic block diagram of an exemplary memory unit 2. The memory unit 2 can include a core memory array 4 containing a plurality of memory devices, such as dual cell, non-volatile, flash electrically erasable and programmable memory devices. For example, the memory devices can be charge trapping dielectric flash memory devices as will be discussed in greater detail below.

The memory devices of the core memory array 4 can include a plurality of core memory devices 6 and at least one associated dynamic reference memory device 8. In one embodiment, the array 4 can be arranged such that the dynamic reference memory device(s) 8 are formed within a matrix of the core memory devices 6.

Other memory devices, such as external references 10, can also form a part of the memory unit 2. The external reference 10 are separate from the core memory array 4 and can include, for example, erase verify reference cells, program verify reference cells and soft programming reference cells.

As one skilled in the art will appreciate, the core memory devices 6 can be used by a customer of the memory unit 2 to store information, such as data or executable code. The dynamic reference(s) 8 can be used to assist in reading the core memory devices 6. More specifically, the dynamic reference(s) 8 are used as indicators of the data level behavior of the core memory devices 6. Briefly, each charge storing cell of the dynamic reference 8 can be programmed to store an amount of charge such that the dynamic reference 8 has a certain threshold voltage. Over time, the charge amount stored by the cells of the dynamic reference 8 and other factors contributing to the threshold voltage of the dynamic reference 8 may change. These changes cause a corresponding change in the threshold voltage of the dynamic reference 8. The change in dynamic reference 8 threshold voltage can be used by a logic circuit 12 associated with the memory unit 2 to account for drift in threshold voltage of the remaining core memory devices 6. For example, the logic circuit 12 can refresh or reprogram the core memory devices 6 and/or the dynamic reference memory device(s) 8 based on the change in dynamic reference 8 threshold voltage. According to certain aspects of the invention, the invention is directed to a method for programming the dynamic reference device(s) 8 to have improved tracking with the core memory cells 6.

Figure 2:
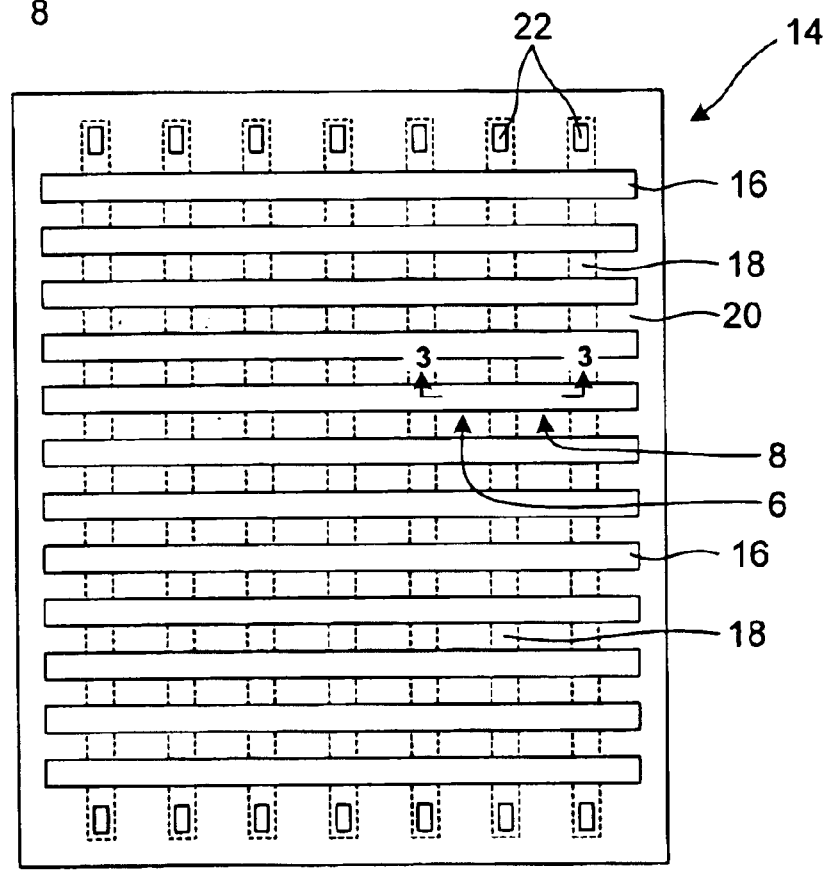
FIG. 2 is a schematic block diagram of a portion of a core memory array from the memory unit that can include one or more dynamic reference devices.

With additional reference to FIG. 2, shown is a top view, schematic block diagram of a portion, or sector 14, of the core memory array 4 from the memory unit 2. The sector 14 can include core memory devices 6 and one or more dynamic reference devices 8. The sector 14 can include word lines 16 and bit lines 18 arranged with a dielectric stack 20 to operatively form the core memory devices 6 and the dynamic reference device(s) 8. Application of appropriate voltages to the word lines 16 and the bit lines 18 allows for the addressing of the memory devices 6, 8 of the sector 14 such that each memory device can be programmed, read, verified and/or erased. Bit line contacts 22 can be used to establish electrical connection to the bit lines 18 through the dielectric stack 20.

Figure 3:
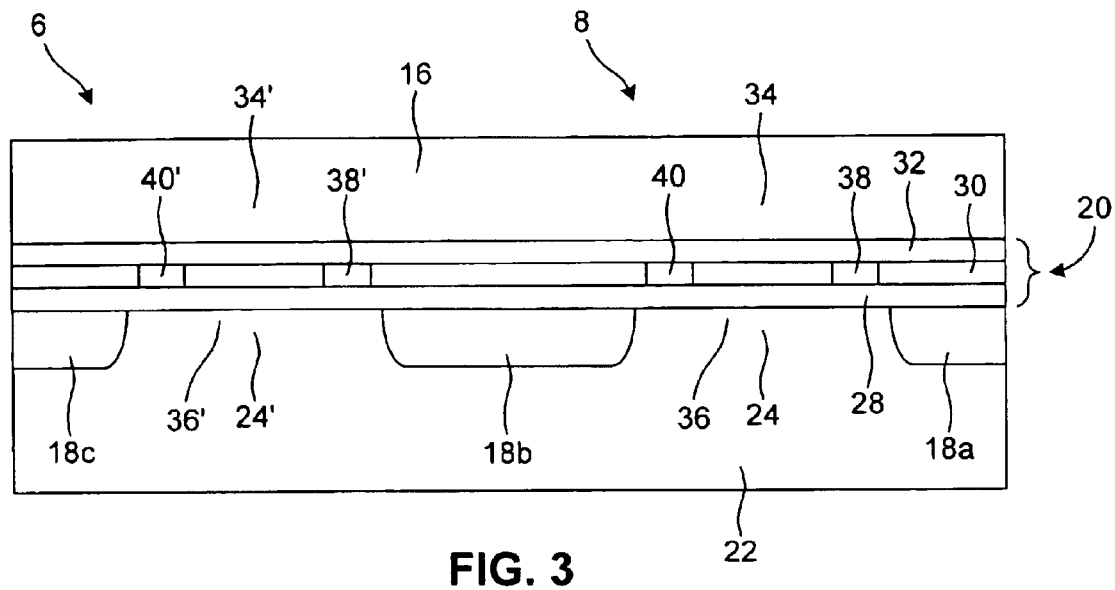
FIG. 3 is a schematic cross-section illustration of exemplary memory devices from the core memory array taken along the line 3—3 of FIG. 2.

With additional reference to FIG. 3, a portion of the sector 14 is illustrated in cross-section to illustrate an exemplary arrangement of the memory devices of the core memory array 4. The cross-section of FIG. 3 shows a core memory device 6 adjacent a dynamic reference memory device 8. Each of these memory devices can be implemented as a virtual ground, dual cell, non-volatile, flash electrically erasable and programmable memory devices. It should be understood that the illustrated memory devices 6, 8 are shown for exemplary purposes and can be implemented with alternative structures (e.g., in stacked gate arrangement, in recessed gate arrangement, etc.). In addition, the relative positioning of the core memory devices 6 with respect to the dynamic reference 8 can be modified.

The exemplary memory devices 6, 8 are implemented as a charge trapping dielectric type flash memory devices, each of which include a pair of complimentary charge trapping regions that can be independently programmed and read.

For simplicity of the discussion herein, only the arrangement of the dynamic reference device 8 will be described. However, the core memory device 6 has a corresponding structure and operation. Therefore, the reference numerals used to described the dynamic reference device 8 will also be used for the core memory device 6, but with a prime symbol appended to the end of the reference numeral.

In the illustrated embodiment, the core device 6 and the dynamic reference 8 include a P-type semiconductor substrate 22. Within the substrate 22, the bit lines 18 are formed in a buried bit line format. The bit lines 18 (also referred to herein as conductive regions) can be formed by implanting N-type dopant into the substrate 22, or from a metal or metal containing compound (e.g., silicide bit lines 18). For each device 6, 8, adjacent pair of bit lines 18 form conductive regions that function as a source and a drain during various programming and reading operations. For each device, a body 24 is disposed between the adjacent pairs of bit lines 18.

Above the substrate 22 is the dielectric stack 20. The dielectric stack 20 includes a bottom dielectric layer 28 (also referred to as a tunneling dielectric layer) that is made from, for example, silicon oxide ($SiO_2$), other standard-K material (e.g., have a relative permittivity below ten) or a high-K material (e.g., have a relative permittivity, in one embodiment, above ten and, in one embodiment, above twenty).

Over the bottom dielectric layer 28 is a charge trapping layer (also referred to as a charge storing layer 30). The charge storing layer 30 can be made from, for example, a non-conductive material including silicon nitride ($Si_3N_4$) or other suitable material.

Over the charge storing layer 30 is another dielectric layer (also referred to as a top dielectric layer 32) made from a material such as, for example, silicon oxide, other standard-K material or a high-K material.

The word lines 16 are formed over the top dielectric layer 32. For each device 6, 8, one of the word lines 16 functions as a gate electrode 34. The word lines 16 can be formed from, for example, polycrystalline silicon. In alternative arrangements, the gate electrodes 34 can be formed from interconnected conductive islands or pads. A work function of the word line 16 and the dielectric stack 20 controls a channel 36 within the body 24, extending from one bit line 18a to an adjacent bit line 18b.

As one skilled in the art will appreciate, modifications to the memory devices 6, 8 can be made. Such modifications can include changes to the physical arrangement of the memory devices 6, 8 materials used, doping parameters and the like. However, the programming, verifying, reading and/or erasing techniques described herein can be used in conjunction with such a modified device.

The memory devices 6, 8 can be configured as a virtual ground devices. That is, during various operations of the memory devices 6, 8, either of the bit lines 18 associated with the memory device 6, 8 can function as a source of electrons or holes by respectively controlling the voltage potentials applied to the bit lines 18. In addition, the bit line 18 functioning as the source of electrons and/or holes can be grounded or can be connected to a bias potential.

As will become more apparent from the discussion below, within the charge storing layer 30, the dynamic reference 8 includes a first charge storing region (also referred to herein as a normal cell, a right-hand bit or a first charge storing cell 38) adjacent one of the conductive regions (e.g., the bit line identified as bit line 18a) and a second charge storing region (also referred to herein as a complimentary cell, a left-hand bit or a second charge storing cell 40) adjacent the other of the conductive regions (e.g., the bit line identified as bit line 18b). The illustrated core memory device 6 is arranged in similar fashion with a first charge storing cell 38' adjacent bit line 18b and a second charge storing cell 40' adjacent bit line 18c.

Each charge storing cell 38, 40 can have two data states. The data states can represent binary values such as a logical zero and a logical one. The logical one, for example, can be implemented by leaving the desired charge storing cell 38, 40 in an unprogrammed state or blank program level. The logical zero, for example, can be implemented by storing an amount of charge in the desired charge storing cell 38, 40. This condition is also referred to as a charged state, a programmed state, a programmed level or a charged program level. The charge storing regions 38' and 40' of the core memory device 6 has similar data state retention capability.

In the illustrated embodiment, the memory device 8 is a structurally symmetrical device allowing for programming, verifying, reading and erasing of the first charge storing cell 38 and the second charge storing cell 40 by respectively switching the roles of the bit lines 18a and 18b (source and drain) during those operations. Therefore, the bit lines 18a, 18b will be referred to interchangeably by the terms source and drain, depending on the charge storing cell 38, 40 of interest.

As used herein, the term "dual-bit" data storage refers to independently "programming" each charge storing cell 38, 40 with amount of charge selected from one of two distinguishable amounts of charge corresponding to the data states (the data states also being referred to herein as the blank program level and the charged program level).

For purposes of the present disclosure, the programming technique to store the charged program level with either of the charge storing cells 38, 40 involves hot electron injection, also referred to as channel hot electron injection (CHE). However, it should be appreciated that modifications to the programming techniques can be made to accommodate variations in the specific memory device used.

Using hot electron injection, the first charge storing cell 38 can be programmed to the charged program level by applying voltages to the bit line 18a (functioning as the drain) and to the word line 16 (functioning as the gate electrode 34). The other bit line 18b functions as the source (i.e., source of electrons) for the CHE programming of the charge storing cell 38. In one embodiment, a bias voltage potential is also applied to the source (rather than grounding or floating the source as found in conventional charge trapping dielectric flash memory devices). As a result of the application of a bias potential to the source during programming, greater control over electron injection can be accomplished, which leads to enhanced data retention capability of the memory device 8.

The voltages applied to the gate electrode 34, the source and the drain generate a vertical electric field through the dielectric layers 28, 32 and the charge storing layer 30 and a lateral electric field along the length of the channel 36 from the source to the drain. At a given threshold voltage, the channel 36 will invert such that electrons are drawn off the source and begin accelerating toward the drain. As the electrons move along the length of the channel 36, the electrons gain energy and upon attaining enough energy, the electrons are able to jump over the potential barrier of the bottom dielectric layer 28 and into the charge storing layer 30 where the electrons become trapped. The probability of electrons jumping the potential barrier is a maximum in the area of the charge storing cell 38 adjacent the drain (i.e., bit line 18a), where the electrons have gained the most energy. These accelerated electrons are termed hot electrons and once injected into the charge storing layer 30, stay in the charge storing cell 38 of the charge storing layer 30. The trapped electrons tend not to spread through the charge storing layer 30 due to this layer's low conductivity and low lateral electric field therein. Thus, the trapped charge remains localized in the charge trapping region of the charge storing cell 38 close to the adjacent bit line 18a.

The foregoing technique to program the first charge storing cell 38 can be used to program the second charge storing cell 40, but the functions of the bit lines 18a and 18b (i.e., source and drain) are reversed. In addition, the same programming procedure can be used for programming of the cells 38' and 40' of core memory device 6.

Reading of the cells 38, 40 of the dynamic reference 8 or the cells 38', 40' of the core memory device 6 can be carried using, for example, a reverse read operation. For example, to read the first charge storing cell 38, a voltage can be applied to the conductive region opposite the first charge storing region 38 (i.e., bit line 18b, which is also referred to as the drain during read operations) and a voltage can be applied to the gate electrode 34. The conductive region adjacent the first charge storing region 38 (i.e., bit line 18a, which is also referred to as the source during read operations) can be grounded. To read the second charge storing cell 40, the roles of the conductive regions can be reversed. The read operation drain voltage functions to mask, or "cover up," charge stored by the "unread" charge storing cell 38, 40.

During the read operation of the dynamic reference device 8 an amount of current drawn across the channel 36 can be used to generate a reference current for use in reading the core memory device 6. That is, during the read operation of the core memory device 6, an amount of current drawn across the channel 36' within body 24' can be compared against the reference current to determine the data state of the "read" one of the charge storing cells 38', 40'.

Figure 4:
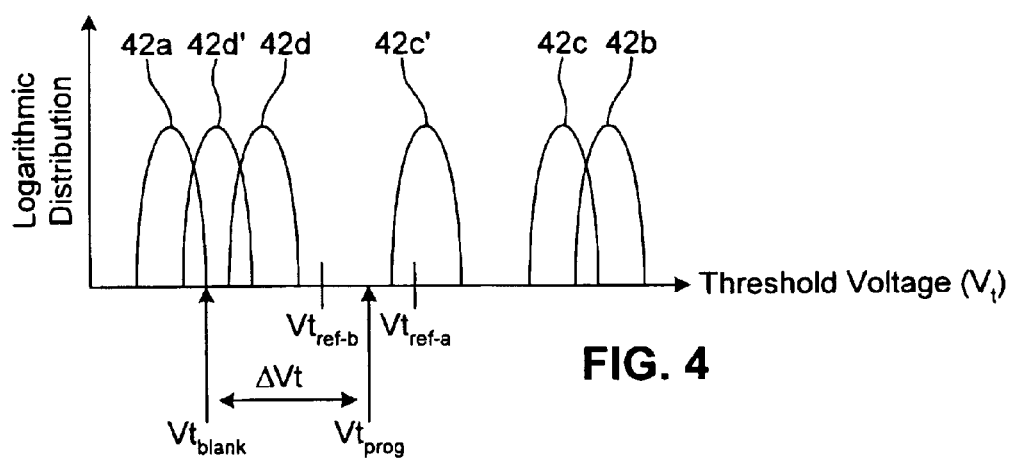
FIG. 4 is a population plot that includes relative program level threshold voltage distributions for the devices of the core memory array.

With additional reference to FIG. 4, shown is a population plot that includes relative threshold voltage (Vt) distributions 42 which are indicative of the data state behavior of the dynamic reference device 8 when the charge storing cells 38, 40 are placed in various respective data states. The population plot of FIG. 4 also applies to the data state behavior of the core memory device 6, but will only be described with respect to the dynamic reference memory device 8. Therefore, changes to the relative threshold voltage distributions 42 of the dynamic reference 8 can be used to assist in reading the core memory device 6. It is noted that the data state of each of the charge storing cells 38, 40 can be the same or different to take advantage of the asymmetrical data retention ability of charge trapping dielectric flash memory devices.

A first distribution 42a represents a logarithmic threshold voltage distribution for the dynamic reference 8 when both charge storing cells 38, 40 store respective charge amounts corresponding to the blank program level. That is, when one of the charge storage cells 38, 40 is read and both charge storing cells 38, 40 are in the blank state, the threshold voltage of the dynamic reference should fall within the first distribution 42a. Using the corresponding binary data values for this data storage condition, the first distribution 42a can be referred to as a "11" state, where the first "1" of the "11" corresponds to charge storing cell 38, 40 being read (or "read bit") and the second "1" of the "11" corresponds to the other of the charge storing cells 38, 40 (or "unread bit"). A maximum value of the first distribution 42a represents an erase or blank threshold voltage ($Vt_{blank}$) of the dynamic reference 8.

A second distribution 42b represents a logarithmic threshold voltage distribution for the dynamic reference 8 when both charge storing cells 38, 40 store respective charge amounts corresponding to the charged program level. That is, when one of the charge storage cells 38, 40 is read and both charge storing cells 38, 40 are in the charged state, the threshold voltage of the dynamic reference should fall within the second distribution 42b. Using the corresponding binary data value for this data storage condition, the second distribution 42b can be referred to as a "00" state, where the first "0" of the "00" corresponds to the read bit and the second "0" of the "00" corresponds to the unread bit.

A third distribution 42c represents a logarithmic threshold voltage distribution for the dynamic reference 8 when the read one of the charge storing cells 38, 40 stores a charge amount corresponding to the charged program level and the unread one of the charge storing cells 38, 40 stores a charge amount corresponding to the blank program level. Using the corresponding binary data value for this data storage condition and the first and second digit naming convention identified above, the third distribution 42b can be referred to as a "01" state.

A fourth distribution 42d represents a logarithmic threshold voltage distribution for the dynamic reference 8 when the read one of the charge storing cells 38, 40 stores a charge amount corresponding to the blank program level and the unread one of the charge storing cells 38, 40 stores a charge amount corresponding to the charged program level. Using the corresponding binary data value for this data storage condition and the first and second digit naming convention identified above, the fourth distribution 42d can be referred to as a "10" state. The "10" state can also be referred to as a complimentary bit disturb (CBD) state where the charge stored by the unread bit has the effect of slightly increasing the threshold voltage of the memory device 6, 8 above the blank state distribution 42a.

Over multiple program/erase (P/E) cycles and aging of the memory unit 2 (FIG. 1), the data retention of ability (i.e., charge storing ability) of the charge storing cells 38, 40 may become degraded, such as by damage to the bottom dielectric layer 28. It is noted that the aging may be actual aging of the device (e.g., after ten years or so) or artificial aging (e.g., by a "bake" procedure where the memory unit 2 is operated at an elevated temperature). As a result of this degradation, the third threshold voltage distribution 42c corresponding to the "01" state may shift downward along the threshold voltage ($V_t$) axis of the population plot of FIG. 4. Such shifting is represented in FIG. 4 by a post cycling, or "actual 01" state threshold voltage distribution 42c'. Similarly, the fourth threshold voltage distribution 42d corresponding to the "10" state may shift downward along the $V_t$ axis of the population plot of FIG. 4. Such shifting is represented in FIG. 4 by a post cycling, or "actual 10" state threshold voltage distribution 42d'.

As indicated, a reference threshold value (corresponding to the reference current) can be used to distinguish the blank program level and the charged program level of the core memory device 6. Prior to cycling, a pre-cycling reference threshold value (or $Vt_{ref-a}$) can be derived by averaging the "01" state threshold voltage distribution 42c and the "10" state threshold voltage distribution 42d of the dynamic reference 8. However, after cycling, it is possible that at least a portion of the post cycling "01" state threshold voltage distribution 42c' for the core memory device 6 may fall below the pre-cycling reference threshold value $Vt_{ref-a}$, which could lead to inaccurate reading of the memory unit 2. To compensate, a new reference threshold value can be derived prior to reading the core memory device 6 by averaging the actual "01" state threshold voltage distribution 42c' and the actual "10" state threshold voltage distribution 42d' of the dynamic reference 8 to derive a post-cycling reference threshold value (or $Vt_{ref-b}$).

The dynamic reference 8 should be physically and operationally configured to behave in a manner that predictably corresponds to the behavior of the core memory cells 6. In this way, the post-cycling reference threshold value $Vt_{ref-b}$ has the highest probability of accurately functioning as a reference voltage (corresponding to the reference current) for use in reading of the core memory cells 6. Exemplary methods for operationally configuring the dynamic reference 8 are respectively illustrated in FIGS. 5 and 6.

Figure 5:
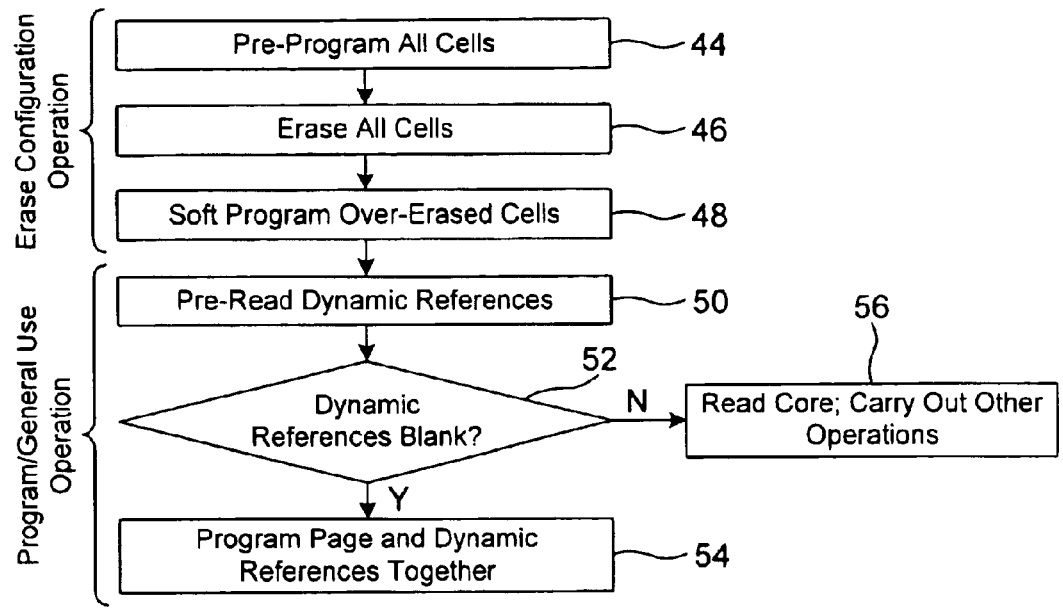
FIG. 5 is a flow diagram of a first exemplary method of programming a dynamic reference memory device.

With additional reference to FIG. 5, shown is a flow diagram of a first exemplary method of programming a dynamic reference memory device 6. The method of FIG. 5 can be viewed as having two operational portions. A first portion can be used to carry out an erase configuration operation for the memory unit 2 and a second portion can be used to carry out programming of the memory unit 2 and other general use functions.

The method illustrated in FIG. 5 can start in block 44 where all of the charge storing cells of the memory array 4 are pre-programmed. The pre-programmed cells can include the charge storing cells 38', 40' of the core memory devices 6 and the charge storing cells 38, 40 of the dynamic reference(s) 8.

Pre-programming of the charge storing cells 38, 40, 38' and 40' can include injecting charge into the cells. More specifically, sufficient charge can be injected to raise the threshold voltage of each core memory device 6 and the dynamic reference(s) 8 to the "00" program state.

Thereafter, in block 46, each charge storing cell 38, 40, 38' and 40' that was pre-programmed. in block 40 can be erased. Erasing the charge storage cells 38, 40, 38' and 40' can be carried out using conventional techniques, such as a band-to-band (BTB) hot hole injection technique that removes charge from the charge storing cells 38, 40, 38' and 40'. In block 48, any charge storing cells 38, 40, 38' and 40' that were over-erased during the erase carried out in block 46 can be soft programmed. Soft-programming of over-erased charge storing cells 38, 40, 38' and 40' is relatively well known in the art and will not be described in great detail herein. Soft-programming can include raising the amount of charge stored by the over-erased charge storing cells 38, 40, 38' and 40' such that the threshold voltage of the corresponding memory device 6, 8 is above a predetermined amount (e.g., a minimum threshold voltage of the blank state threshold voltage distribution 42a (FIG. 4)).

Following block 48, the erase configuration operation portion of the method of FIG. 5 is concluded and the memory unit 2 can be programmed to store data in the core memory array 4 as implemented with the remaining portion of the method. The method can continue in block 50 where a pre-read of one or more dynamic reference devices 8 can be carried out. It is noted that a read operation of the core memory devices 6 cannot be effectively carried out if the dynamic references 8 are blank since no read operation reference currents will be available.

The method can continue in decision block 52. If, in block 52, the dynamic references 8 are blank, then the logic circuit 12 can include logic that concludes that an entire core memory cell 6 page is blank (i.e., that the core memory devices 6 are not programmed to store data). The method can then continue in block 54 where the core memory devices 6 and the dynamic references 8 are programmed together. In one embodiment, during programming of a cell 38, 40 of a dynamic reference device 8, at least one cell 38', 40' of a core memory device 6 is programmed at the same time (e.g., with the same program pulse(s)). Alternatively, the dynamic references 8 can be programmed immediately before, immediately after or interleaved with programming of the core memory devices 6.

Programming of the dynamic references 8 and core memory devices 6 in block 50 can follow a page programming routine. For example, groups of charge storing cells 38, 40, 38', 40' can be sequentially programmed one group at a time until all charge storing cells 38, 40, 38', 40' to be programmed are programmed. A group can be comprised of about four to about thirty-two charge storing cells 38, 40, 38', 40'. In one embodiment, a group can be comprised of about eight charge storing cells 38, 40, 38', 40'. As indicated, in one embodiment, any group having a cell 38, 40 of a dynamic reference device 8 can also include at least one cell 38', 40' of a core memory device 6. Depending on the number of dynamic reference devices 8 to be programmed and the number of dynamic reference 8 charge storing cells 38, 40 included in each program group, all of the dynamic reference devices 8 to be programmed may be programmed prior to programming of all core memory device 6 charge storing cells 38', 40' that are to be programmed. Once all dynamic reference device 8 are programmed, the program operation can continue programming core memory device 6 charge storing cells 38', 40' as desired.

As should be appreciated, the dynamic reference devices 8 are programmed under the same or very similar conditions as programming of the core memory devices 6. This approach to dynamic reference device 8 programming can be advantageous. For example, the loading on a voltage supply (or supplies) (not shown) used to provide the gate voltage ($V_g$), drain voltage ($V_d$) and/or source voltage ($V_s$) during programming can be equalized. As a result, the current drawn by each memory device 6, 8 during programming can be the same or approximately the same even across program groups. Hence, electron injection for each programmed charge storing cell 38, 40, 38', 40' can roughly be the same, even across program groups. As a result, tracking of the dynamic references 8 with the core memory devices 6 can be improved. The improved tracking can be realized over repeated program/erase cycling of the memory unit 2 for improved end-of-life (EOL) data retention capability of the memory unit 2. Furthermore, refreshing of the dynamic references 8 prior to programming and/or reading of the core memory devices 6 as found in the prior art can be avoided.

If, in block 52, the dynamic references 8 have been programmed, then the logic circuit 12 can conclude that the core memory devices 6 and the dynamic reference memory devices 8 have been programmed and the method can proceed to block 56. In block 56, the memory unit 2 can be read. Alternatively, other operations can be carried out in block 56. For example, the memory unit 2 can be reprogrammed to store a different set of data than was previously stored, including programming dynamic references 6 and core memory devices 4 together as described with respect to block 54.

Figure 6:
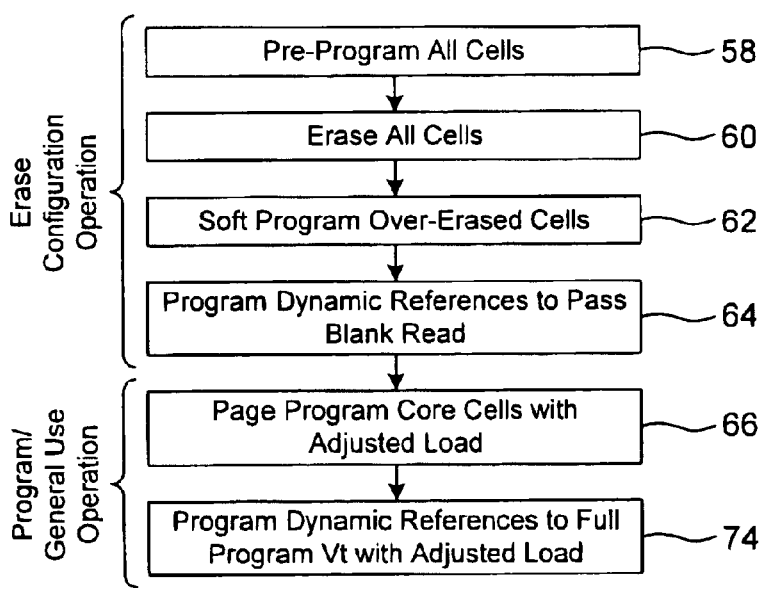
FIG. 6 is a flow diagram of a second exemplary method of programming a dynamic reference memory device.

With additional reference to FIG. 6, shown is a flow diagram of a second exemplary method of programming a dynamic reference device 8. Similar to the method of FIG. 5, the method of FIG. 6 can be viewed as having two operational portions. A first portion can be used to carry out an erase configuration operation for the memory unit 2 and a second portion can be used to carry out programming of the memory unit 2 and other general use functions.

The method illustrated in FIG. 6 can start in block 58 where each charge storing cell 38, 40 of the dynamic references 8 and each charge storing cell 38', 40' of the core memory devices 6 are pre-programmed.

Pre-programming of the charge storing cells 38, 40, 38' and 40' can include injecting charge into the cells. More specifically, sufficient charge can be injected to raise the threshold voltage of each core memory device 6 and the dynamic reference(s) 8 to the "00" program state.

Thereafter, in block 60, each charge storing cell 38, 40, 38' and 40' that was pre-programmed in block 58 can be erased. Erasing the charge storage cells 38, 40, 38' and 40' can be carried out using conventional techniques, such as a band-to-band (BTB) hot hole injection technique that removes charge from the charge storing cells 38, 40, 38' and 40'. In block 62, any charge storing cells 38, 40, 38' and 40' that were over-erased during the erase carried out in block 60 can be soft programmed. Soft-programming of over-erased charge storing cells 38, 40, 38' and 40' is relatively well known in the art and will not be described in great detail herein. Soft-programming can include raising the amount of charge stored by the over-erased charge storing cells 38, 40, 38' and 40' such that the threshold voltage of the corresponding memory device 6, 8 is above a predetermined amount (e.g., a minimum threshold voltage of the blank state threshold voltage distribution 42a (FIG. 4)).

Next, in block 64, the dynamic references 8 can be "lightly" programmed. That is, the charge storing cells 38, 40 of the dynamic references 8 can be injected with charge such that a threshold voltage of the dynamic references 8 is increased from below a blank state threshold voltage $Vt_{blank}$ (FIG. 4) to about a lightly programmed threshold voltage $Vt_{prog}$ (FIG. 4). The lightly programmed threshold voltage $Vt_{prog}$ can be below a minimum threshold voltage of the "01" threshold voltage distribution 42c (FIG. 4). In other words, the threshold voltage of the dynamic references 8 is raised in block 64 a differential amount $\Delta Vt$ (FIG. 4) so that the threshold voltage of the dynamic references 8 is higher than the blank state ("11") threshold voltage distribution 42a, but lower then a programmed state threshold distribution 42b or 42c. As a result, the dynamic references 8 will pass a blank state read (or verify) operation but, in one embodiment, will not store enough charge to fall within a program state threshold voltage distribution 42b or 42c. This step is carried out to satisfy a blank read operation that may be executed by the logic circuit 12 to confirm that the dynamic references 8 have a threshold voltage greater than $Vt_{blank}$. The lightly programmed threshold voltage $Vt_{prog}$ is selected such that during programming, a desired threshold voltage of the dynamic reference 8 will not be "overshot."

Following block 60, the erase configuration operation portion of the method of FIG. 6 is concluded and the memory unit 2 can be programmed to store data in the core memory devices 6 as implemented with the remaining portion of the method. Therefore, the method can continue in block 66 where the charge storing cells 38', 40' of the core memory devices 6 are programmed. The core memory devices 6 can be programmed using a page program operation. For example, groups of charge storing cells 38', 40' can be sequentially programmed one group at a time until all charge storing cells 38', 40' to be programmed are programmed. A group can be comprised of about four to about thirty-two charge storing cells 38', 40'. In one embodiment, a group can be comprised of about eight charge storing cells 38', 40'. In one embodiment, the core memory devices 6 can be programmed using adjusted current loads. More specifically, circuitry can be used during the application of the program voltages (the program voltages including the gate voltage ($V_g$), the drain voltage ($V_d$) and/or the source voltage ($V_s$)) to balance the program conditions for each charge storing cell 38', 40' that is programmed. As a result, each charge storing cell 38', 40' that is programmed to the same program level and in any program group can have the same or approximately the same program voltages applied thereto. Balancing, or adjusting, the program voltages can lead to similar current draw by each programmed core memory device 6. Balancing the program voltages and currents also can lead to injecting charge as desired into the charge storing cells 38', 40'. That is, the amount of injected charge and the lateral placement of that charge in the charge storing cells 38', 40' with respect to the channel 36' can be controlled.

Figure 7:
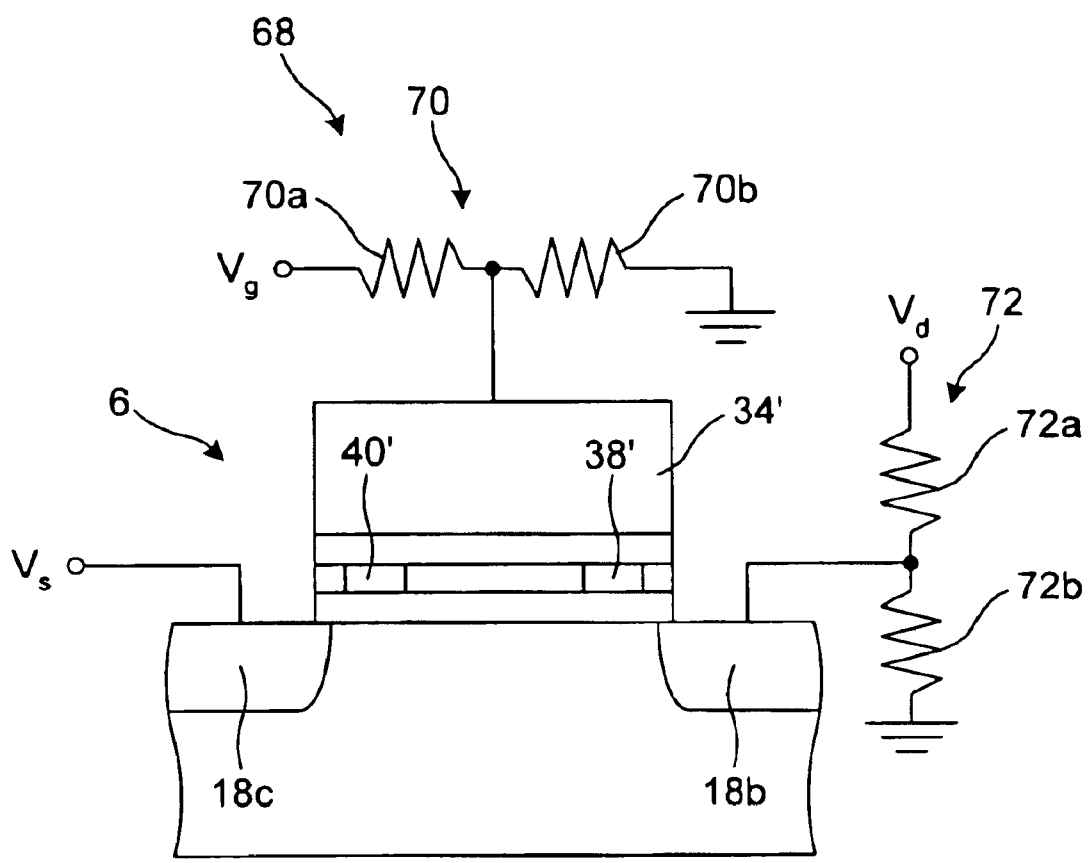
FIG. 7 is a schematic representation of a circuit for adjusting current load for the memory devices of the core memory array during programming.

With additional reference to FIG. 7, a schematic representation of a circuit 68 for adjusting the current load applied to the core memory device 6 during programming of one of the charge storing cells 38', 40' is illustrated. The circuit 68 includes at least two voltage dividers, or resistor ladders 70, 72. A first of the resistor ladders 70 is coupled to the gate electrode 34'. A second of the resistor ladders 72 is coupled to the conductive region (e.g., drain) adjacent the charge storing cell 38', 40' being programmed. In the illustrated embodiment, the right-hand charge storing cell 38' is configured to be programmed and the second resistor ladder 72 is coupled to the bit line 18b, which functions as the drain. In one embodiment, a third resistor ladder (not shown) can be coupled to the conductive region (e.g., source) opposite the charge storing cell 38', 40' being programming in a similar manner.

Each resistor ladder 70, 72 includes a series resistor (respectively denoted as 70a and 72a) and a parallel resistor (respectively denoted as 70b and 72b). The gate voltage ($V_g$) is coupled to the gate electrode 34' via the series resistor 70a and the gate electrode 34' is coupled to ground via the parallel resistor 70b. By appropriate selection of the ratio between the resistance of the series resistor 70a and the combined resistance of the series resistor 70a and the parallel resistor 70b, the voltage actually applied to the gate electrode 34' can be controlled. Similarly, the drain voltage ($V_d$) is coupled to the drain via the series resistor 72a and the drain is coupled to ground via the parallel resistor 72b. By appropriate selection of the ratio between the resistance of the series resistor 72a and the combined resistance of the series resistor 68a and the parallel resistor 72b, the voltage actually applied to the drain 26' can be controlled.

Referring again to FIG. 6, the method can continue in block 74 where the dynamic reference devices 8 can be programmed. The dynamic reference devices 8 can be programmed using the adjusted load technique as described above for programming of the core memory devices 8. In some situations, there may be about one to about four dynamic reference devices 8. However, programming of core array memory devices 6 may involve, for example, programming eight charge storing cells 38', 40' at one time. This means that the programming circuitry may have a higher load during core cell 38', 40' programming than during dynamic reference cell 38, 40 programming. Thus, the program voltages for program pulses of the dynamic reference devices 8 may be effectively higher than for the core cells (e.g., due to less load on the voltage sources), unless adjustment to the program voltages applied to the dynamic references 8 is made.

As indicated above, it may be desirable to program the dynamic reference devices 8 under the same, or approximately the same, conditions as the core memory devices 6. Accordingly, the dynamic reference devices 8 can be programmed under conditions that model the conditions found when programming a group of core memory devices 6. For example, the circuit 68 (FIG. 7) used for adjusting the load during programming of the core memory devices 6 can be employed for each dynamic reference device 8 undergoing programming. The resistor ladders 70, 72 can be used to lower the program voltages applied to the dynamic reference device 8 to closely resemble the program voltages that were applied to the core memory devices 6.

By proper application of program voltages, programming of the dynamic reference devices 8 can result in charge storage that closely resembles charge storage by the core memory devices 6. As a result, any degradation in charge stored by the dynamic reference devices 8 will have a high likelihood of closely matching the experience of the core memory devices 6, especially over multiple P/E cycles. This improved tracking can lead to increased performance (e.g., improved data retention, read margin, etc.) over the lifetime of the memory unit 2.

It should be appreciated that the load adjustment described with respect to the method of FIG. 6 can be applied to the method of FIG. 5, if desired.

It should be further appreciated that the methods described herein can be modified as desired for the specific memory cells being programmed. For example, certain steps can be omitted, various steps can be added and/or certain steps can be carried out in other orders (e.g., blocks 66 and 74 can be switched). Although particular embodiments of the invention have been described in detail, it is understood that the invention is not limited correspondingly in scope, but includes all changes, modifications and equivalents coming within the spirit and terms of the claims appended hereto.

What is claimed is:

1. A method of programming a memory unit having a plurality of dual cell core memory devices and at least one dual cell dynamic reference device, comprising:

providing the memory unit, wherein the memory unit has been subjected to an erase configuration operation such that each cell of the core memory devices is in a blank state and wherein a threshold voltage of the at least one dynamic reference device is less than a charged program level threshold voltage; and programming the at least one dynamic reference and the core memory devices using a page programming routine.

2. The method according to claim 1, wherein the threshold voltage of the at least one dynamic reference device corresponds to a blank state.

3. The method according to claim 1, wherein the at least one dynamic reference and at least one of the core memory devices are programmed with the same program pulse.

4. The method according to claim 1, wherein the threshold voltage of the at least one dynamic reference device is greater than a blank state threshold voltage.

5. The method according to claim 1, wherein the at least one dynamic reference is programmed with adjusted program voltages to balance current load among all devices programmed during the page programming routine.

6. A method of programming a memory unit having a plurality of dual cell core memory devices and at least one dual cell dynamic reference device, comprising:

providing the memory unit, wherein the memory unit has been subjected to an erase configuration operation such that each cell of the core memory devices and of the at least one dynamic reference is in a blank state;

pre-reading the at least one dynamic reference; and programming at least one cell of the at least one dynamic reference device and at least one cell of at least one core memory device with a program pulse.

7. The method according to claim 6, wherein the erase configuration includes:

pre-programming all cells of the core memory devices and of the at least one dynamic reference device;

erasing all pre-programmed cells; and soft programming any cells that were over-erased during the erasing.

8. The method according to claim 6, wherein programming includes applying program voltages to the at least one dynamic reference and the at least one core memory device, the program voltages including a gate potential, a drain potential and a source bias potential.

9. The method according to claim 6, wherein programming includes adjusting a gate potential and a drain potential that are applied to the at least one dynamic reference device to balance current load among the at least one dynamic reference and the at least one core memory device.

10. The method according to claim 9, wherein the gate and drain potentials are adjusted by coupling the gate and drain potentials to the at least one dynamic reference device respectfully with a first and a second voltage divider.

11. The method according to claim 10, wherein each voltage divider has a series resistor and a parallel resistor, the ratio of the resistance of the series resistor to the combined value of the series and parallel resistors for each voltage divider being selected based on a total number of dynamic reference and core memory devices programmed with the program pulse.

12. The method according to claim 6, wherein the at least one dynamic reference is programmed with the plurality of core memory devices as part of a page programming routine.

13. A method of programming a memory unit having a plurality of dual cell core memory devices and at least one dual cell dynamic reference device, comprising:

providing the memory unit, wherein the memory unit has been subjected to an erase configuration operation such that each cell of the core memory devices is in a blank state and wherein an amount of charge has been injected into at least one cell of the at least one dynamic reference device, the amount of charge establishing a threshold voltage of the dynamic reference device that falls between a blank program state and a charged program state;

programming the at least one cell of the at least one dynamic reference device to the charged program state; and programming at least one cell of at least one core memory device to the charged program state.

14. The method according to claim 13, wherein programming the at least one dynamic reference device includes adjusted a gate potential and a drain potential that are applied to the at least one dynamic reference device such that the applied gate and drain potentials correspond to gate and drain potentials applied to the at least one core memory device during programming of the at least one core memory device.

15. The method according to claim 14, wherein the gate and drain potentials are adjusted by coupling the gate and drain potentials to the at least one dynamic reference device respectfully with a first and a second voltage divider.

16. The method according to claim 15, wherein each voltage divider has a series resistor and a parallel resistor, the ratio of the resistance of the series resistor to the combined value of the series and parallel resistors for each voltage divider being selected based on a total number of simultaneously programmed dynamic reference device cells.

17. The method according to claim 13, wherein the erase configuration includes:

pre-programming all cells of the core memory devices and of the at least one dynamic reference device;

erasing all pre-programmed cells;

soft programming any cells that were over-erased during the erasing; and injecting the amount of charge into the at least one cell of the at least one dynamic reference devices.

18. The method according to claim 13, wherein the at least one dynamic reference and the plurality of core memory devices are programmed as part of a page programming routine.

* * * * *